United States Patent
Kim

(10) Patent No.: US 7,528,001 B2
(45) Date of Patent: May 5, 2009

(54) METHOD OF MANUFACTURING A CMOS IMAGE SENSOR

(75) Inventor: Jin Han Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 208 days.

(21) Appl. No.: 11/615,730

(22) Filed: Dec. 22, 2006

(65) Prior Publication Data

US 2007/0155086 A1     Jul. 5, 2007

(30) Foreign Application Priority Data

Dec. 29, 2005   (KR) .................. 10-2005-0133299

(51) Int. Cl.
*H01L 12/00*   (2006.01)
(52) U.S. Cl. ............................. 438/69; 438/57; 438/70; 438/E21.002; 438/E23.127
(58) Field of Classification Search ............. 438/52–60, 438/64–70
See application file for complete search history.

(56) References Cited

U.S. PATENT DOCUMENTS

| | | | | |
|---|---|---|---|---|
| 5,266,501 A | * | 11/1993 | Imai | 438/60 |
| 5,970,317 A | * | 10/1999 | Mizoguti et al. | 438/70 |
| 2007/0148806 A1 | * | 6/2007 | Kim | 438/59 |
| 2007/0161143 A1 | * | 7/2007 | Kim | 438/57 |

* cited by examiner

*Primary Examiner*—Dung A. Le
(74) *Attorney, Agent, or Firm*—Sherr & Vaughn, PLLC

(57) ABSTRACT

A complementary metal oxide silicon (CMOS) image sensor includes a pad protection layer having a dual-layer structure including a plasma enhanced-tetra ethyl ortho silicate (PE-TEOS) layer as a lower layer and a thermo-setting resin layer as an upper layer. The thermo-setting resin layer is removed before a micro-lens process and after a planarization process. The plasma enhanced-tetra ethyl ortho silicate (PE-TEOS) layer is removed after the planarization process and the micro-lens process.

7 Claims, 6 Drawing Sheets

METHOD OF MANUFACTURING A CMOS IMAGE SENSOR

The present application claims priority under 35 U.S.C. 119 and 35 U.S.C. 365 to Korean Patent Application No. 10-2005-0133299 (filed on Dec. 29, 2005), which is hereby incorporated by reference in its entirety.

BACKGROUND

Hereinafter, a method for manufacturing a related CMOS image sensor will be briefly described. A field insulating layer is formed over a silicon substrate in order to electrically insulate devices from each other. Next, light detectors such as photodiodes are formed, and then an inter-layer dielectric layer and a metal interconnection layer are formed. Thereafter, protection layers such as a passivation oxide layer and a passivation nitride layer are deposited in order to protect devices or a pad from moisture or physical shocks such as scratches. Subsequently, a color filter array is formed to detect color images, and a micro-lens array is formed over the upper part of the color filter array. The color filter array process, the planarization process, and the micro-lens process all include a photoresist coating process. Thus, if a process for protecting a pad is not employed, many problems may occur.

Problems relative to methods for manufacturing the related CMOS image sensor will be described with reference to FIGS. 1A to 1F. FIGS. 1A to 1F are sectional views showing a process of forming a pad and a pad protection layer of a CMOS sensor, a micro-lens process, and a stripping process for the pad protection layer.

As shown in FIG. 1A, a thick passivation oxide layer 110 is deposited over the pad 100 in order to protect the pad 100. A chemical mechanical polishing (CMP) process is performed to planarize the passivation oxide layer 110. A thick passivation nitride layer 120 is formed over the resultant structure, thereby forming a first pad protection layer. Thereafter, a photolithography process is performed with respect to the passivation oxide layer 110 and the passivation nitride layer 120, thereby exposing a pad.

Next, FIG. 1B is a sectional view showing a process of depositing a thin plasma enhanced-tetra ethyl ortho silicate (PE-TEOS) layer or a thin thermo-setting resin layer over the passivation nitride layer 120 as a second pad protection layer 130. A color filter array process, a planarization process, and a micro-lens process, which are the subsequent processes, include a photo process. In this case, the second pad protection layer 130 protects the pad during the photo process. If the PE-TEOS layer is used as the second pad protection layer 130, since an adhesive force between the photoresist and the PE-TEOS layer is inferior, a peeling phenomenon occurs in a color filter. If the thermo-setting resin layer is used as the second pad protection layer 130, since both the thermo-setting resin layer and the photoresist have the same components, an adhesive force between the thermo-setting resin layer and the photoresist is superior. Accordingly the peeling phenomenon is prevented in the color filter. However, if the processes are reworked due to errors occurring in the color filter array process, solvent cleaning is performed in order to strip the photoresist. At this time, the thermo setting resin layer is stripped with the photoresist. Thereafter, a thermo-setting resin layer is deposited, and then a color filter array process is performed again. However, since the solvent cleaning is performed in a state in which the pad 100 is exposed, pad corrosion or pad contamination may be caused. If such pad contamination is caused, the yield rate of wafers and semiconductor packages is reduced when a probe test is performed.

FIG. 1C is a sectional view showing a process of forming a blue/green/red color filter array 140 over the first pad protection layer through a color photo-process. FIG. 1D is a sectional view showing a process of forming a planarization layer 150 through a photo-process for a planarization layer. In addition, FIG. 1E is a sectional view showing a process of forming a micro-lens 160 over the planarization layer 150. The processes include several photo-processes, and a process for forming the micro-lens 160 includes a thermal reflow process involving heating a semiconductor substrate in order to form a convex micro-lens.

FIG. 1F is a sectional view showing a process of removing the second pad protection layer 130 after forming the micro-lens 160. If the PE-TEOS layer serves as the second pad protection layer, the second pad protection layer is removed through a dry etching process using plasma. If the thin thermo-setting resin layer serves as the second pad protection layer 130, the second pad protection layer is removed through oxygen ashing.

SUMMARY

Accordingly, the present embodiments have been made to solve the above-mentioned problems occurring in the related art. Embodiments relate to a method for manufacturing a CMOS image sensor, capable of preventing the peeling of a color filter, pad corrosion, and pad contamination.

Embodiments relate to a method for manufacturing a complementary metal oxide silicon (CMOS) image sensor, the method including the following. An oxide layer and a nitride layer are deposited after forming a pad over a substrate.

The oxide layer and the nitride layer are etched to expose the pad. A plasma enhanced-tetra ethyl ortho silicate (PE-TEOS) layer is deposited as a lower pad protection layer. A thermo-setting resin layer is deposited over the PE-TEOS layer. A color filter array is formed. A planarization layer is formed over the color filter array. The thermo-setting resin layer in a pad area is removed. A micro-lens is formed over the planarization layer. The pad is exposed by removing the plasma enhanced-tetra ethyl ortho silicate (PE-TEOS) layer in the pad area.

The thickness of the plasma enhanced-tetra ethyl ortho silicate (PE-TEOS) layer may be in the range of 200 Å to 500 Å. The thermo-setting resin layer may be removed through oxygen ashing. An oxygen ashing process may be targeted to remove a thermo-setting resin layer between twice to triple the thickness of the thermo-setting resin layer actually deposited over the PE-TEOS layer.

The plasma enhanced-tetra ethyl ortho silicate (PE-TEOS) layer may be removed through dry etch. The thickness of the thermo-setting resin layer may be in the range of 200 Å to 600 Å. An initial thickness of the deposited planarization layer may be about 10,000 Å. The thermo-setting resin layer and the color filter array may both include photoresist.

Embodiments relate to a complementary metal oxide silicon (CMOS) image sensor including a pad protection layer having a dual-layer structure including a plasma enhanced-tetra ethyl ortho silicate (PE-TEOS) layer as a lower layer and a thermo-setting resin layer as an upper layer. The thermo-setting resin layer is removed before a micro-lens process and after a planarization process. The plasma enhanced-tetra ethyl ortho silicate (PE-TEOS) layer is removed after the planarization process and the micro-lens process.

DETAILED DESCRIPTION

Hereinafter, embodiments will be described with reference to FIGS. 2A to 2G.

Figure 1A:
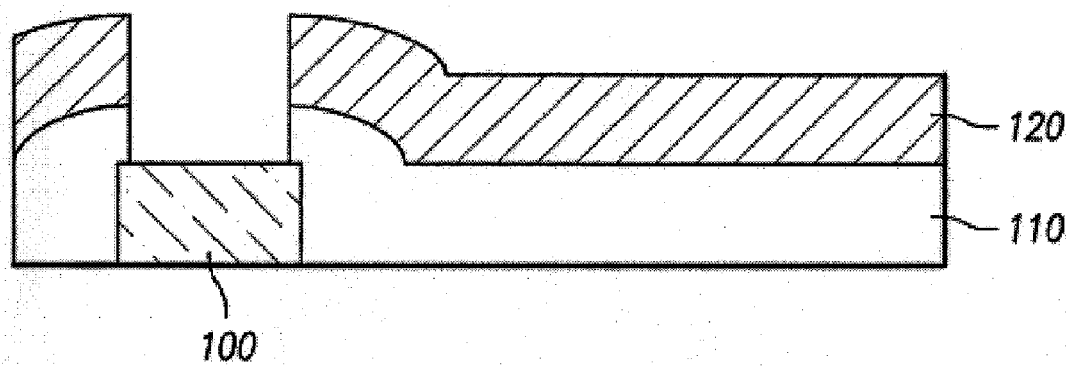
FIGS. 1A to 1F are sectional views showing a method for manufacturing a related CMOS image sensor; and Example
Figure 1B:
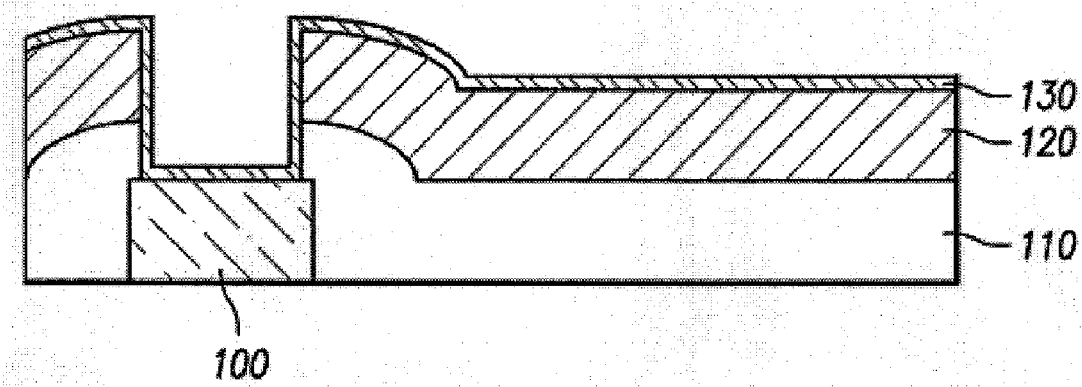
Figure 1C:
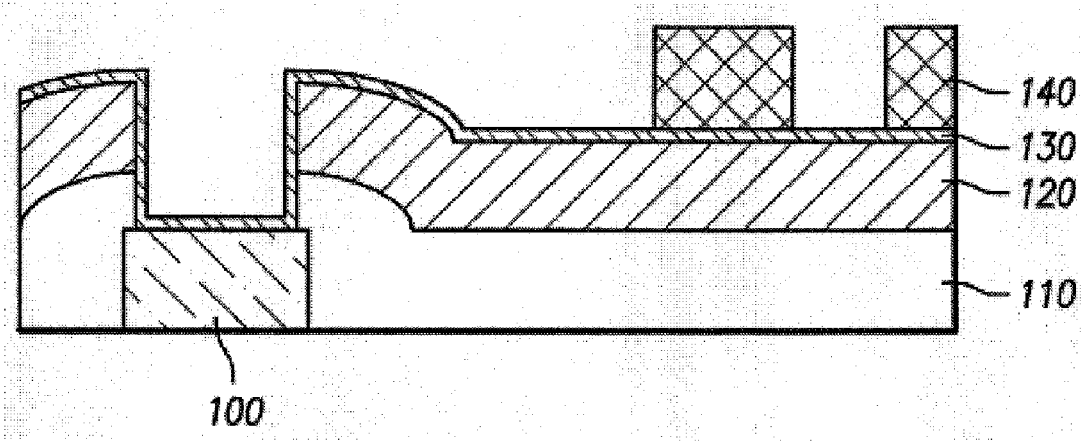
Figure 1D:
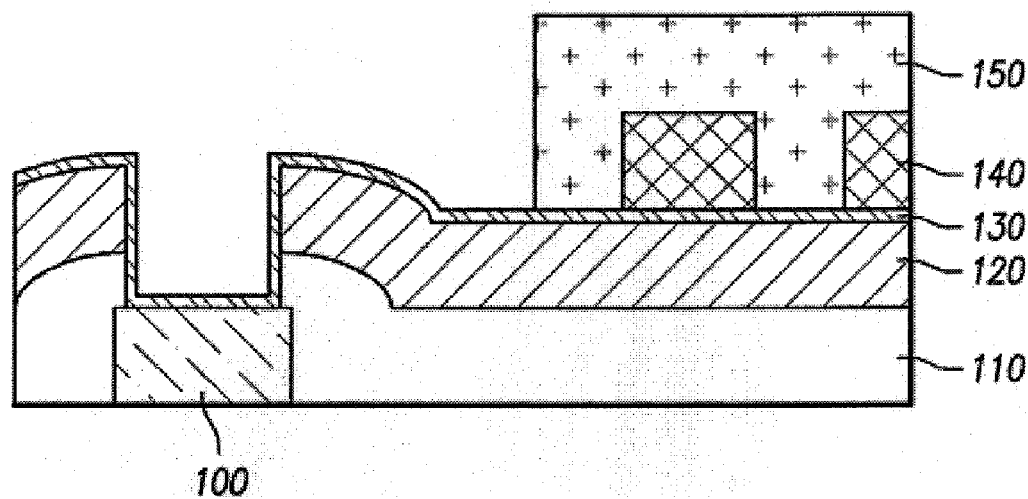
Figure 1E:
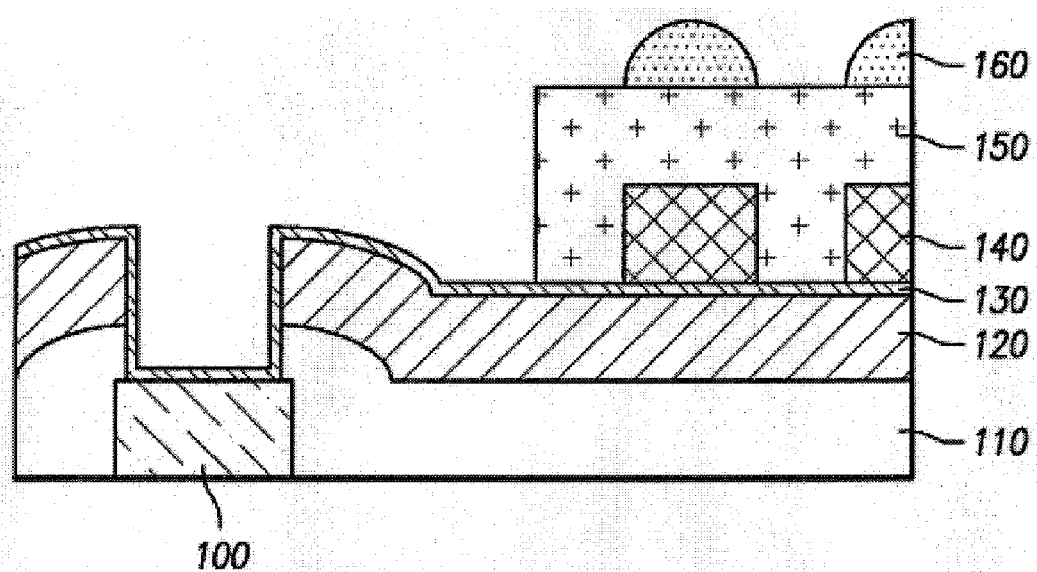
Figure 1F:
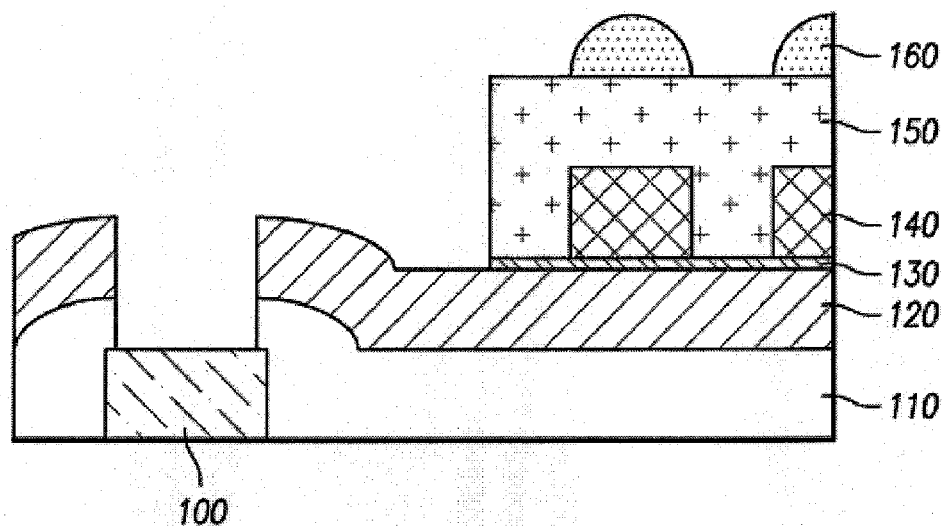
Figure 2A:
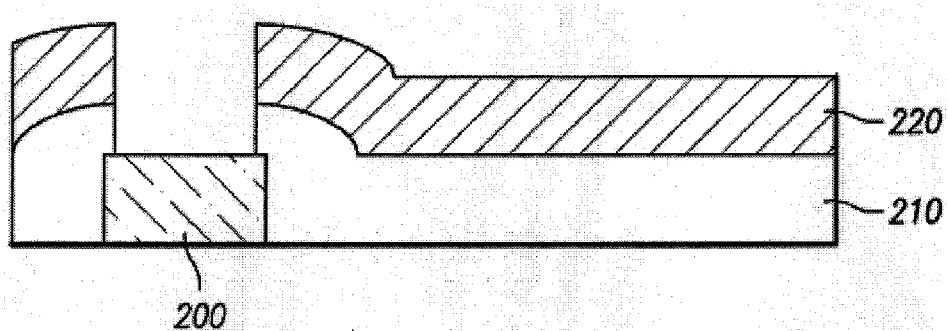
FIGS. 2A to 2G are sectional views showing a method for manufacturing a CMOS image sensor according to embodiments.

As shown in FIG. 2A, a thick passivation oxide layer 210 is deposited over the surface of a semiconductor substrate including a pad 200. The passivation oxide layer 210 is planarized through a chemical mechanical planarization (CMP) process. A passivation nitride layer 220 is deposited, thereby forming a first pad protection layer. Then, the passivation oxide layer 210 and the passivation nitride layer 220 are selectively etched through a photolithography process to expose the pad 200.

Figure 2B:
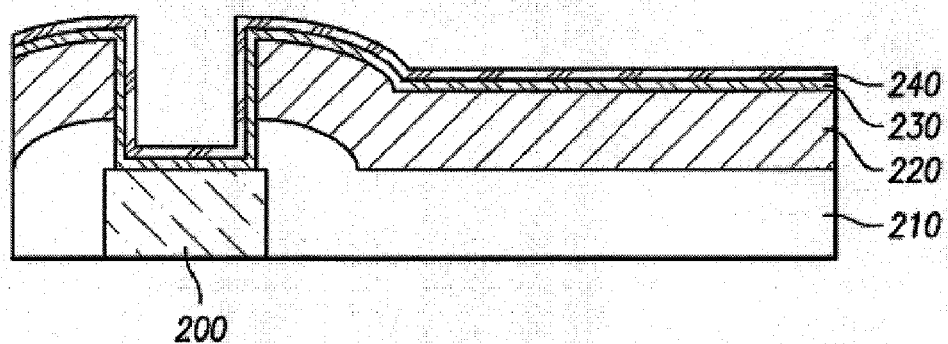

FIG. 2B is a sectional view showing a process of forming a second pad protection layer in order to protect the pad 200 from pad corrosion or pad contamination caused during a color filter array process, a planarization process, and a micro-lens process. The second pad protection layer actually is made of two sub-layers formed by coating a thin PE-TEOS layer 230 and coating a thin thermo-setting resin layer 240 over the PE-TEOS layer 230. The thin PE-TEOS layer 230 may be between 200 Å to 500 Å thick, and the thermo-setting resin layer 240 may be between 200 Å to 600 Å thick. The reason for employing thin layers is to facilitate removal of the second pad protection layer later.

Figure 2C:
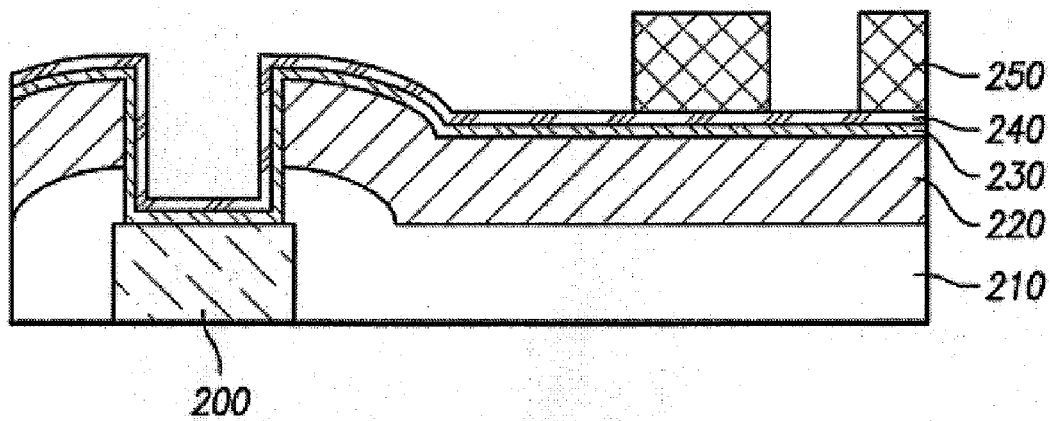

Next, FIG. 2C is a sectional view showing a color filter array 250 formed over the second pad protection layer through a color photoresist process. Three photoresist processes form the blue, green and red filters, and one photoresist process is performed during the planarization process. In the color filter array process, since the thermo-setting resin layer 240, which is the upper sub-layer of the second pad protection layer, includes photoresist, the adhesive force between the thermo-setting resin layer 240 and the color filter 250 is superior. This prevents peeling of the color filter. In addition, since the PE-TEOS layer, which is the lower sub-layer of the second pad protection layer, remains intact even when the color filter array process is reworked, pad corrosion or contamination caused by solvent cleaning is prevented. In other words, peeling problems in the color filter, pad corrosion, and pad contamination problems with a related pad protection layer having a single layer structure are all solved in the embodiments.

Figure 2D:
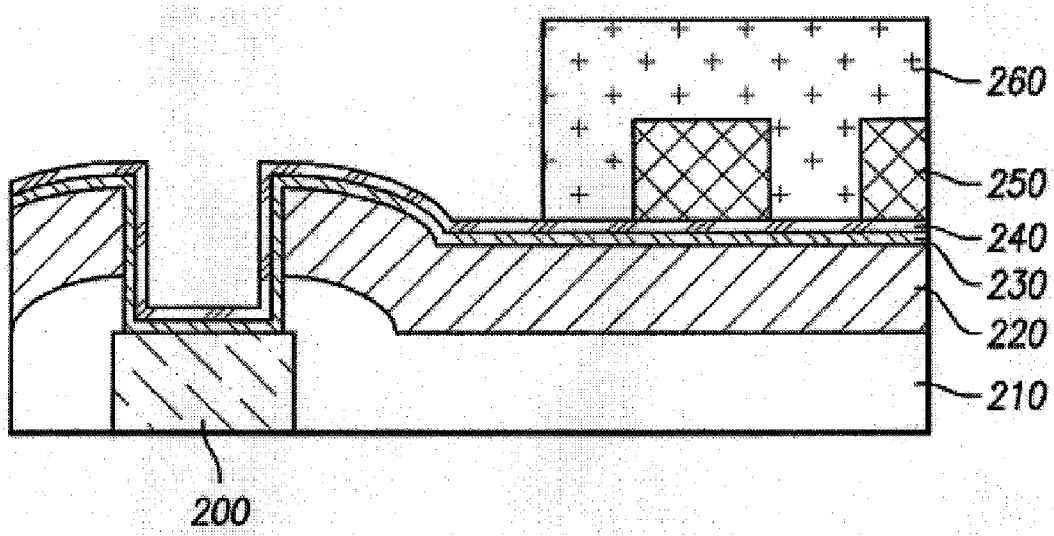

FIG. 2D is a sectional view showing a process of forming a planarization layer 260 through a photoresist process.

Figure 2E:
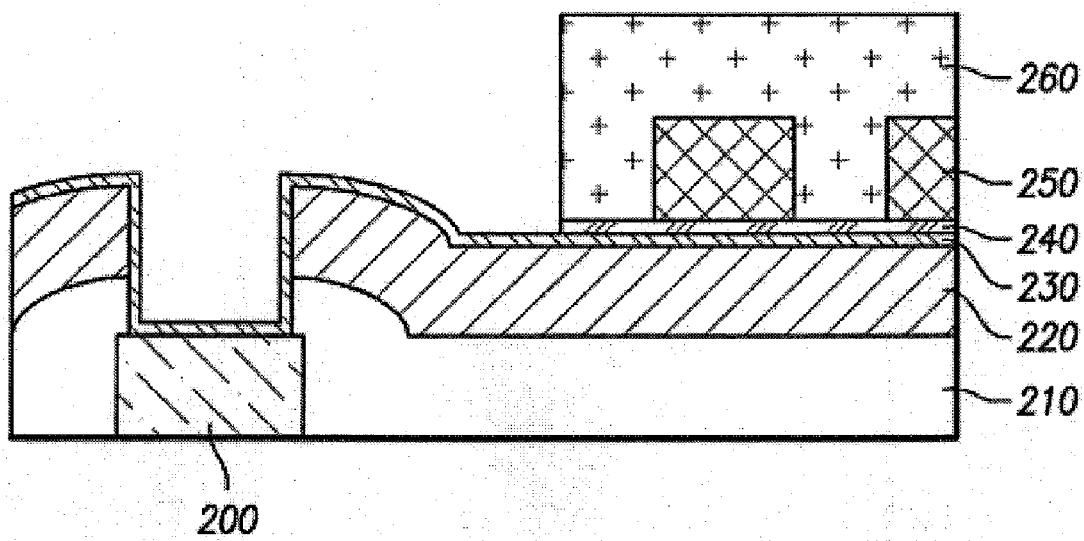

FIG. 2E is a sectional view showing a process of removing the thermo-setting resin layer 240 through oxygen ashing. The portion of the thermo-setting resin layer 240 not covered by the photoresist of the planarization layer 260 is removed. The ashing process is targeted to remove about twice or triple the thickness of the thermo-setting resin layer 240 to ensure that no photoresist of the thermo-setting resin layer 240 remains. Although the thin layer of the thermo-setting resin 240 is obliterated by the ashing process, the ashing process does not exert a negative influence upon the color filter or the planarization layer because the planarization layer 260 is about 10,000 Å thick. The thermo-setting resin layer 240 was about 200 Å to 600 Å thick.

Figure 2F:
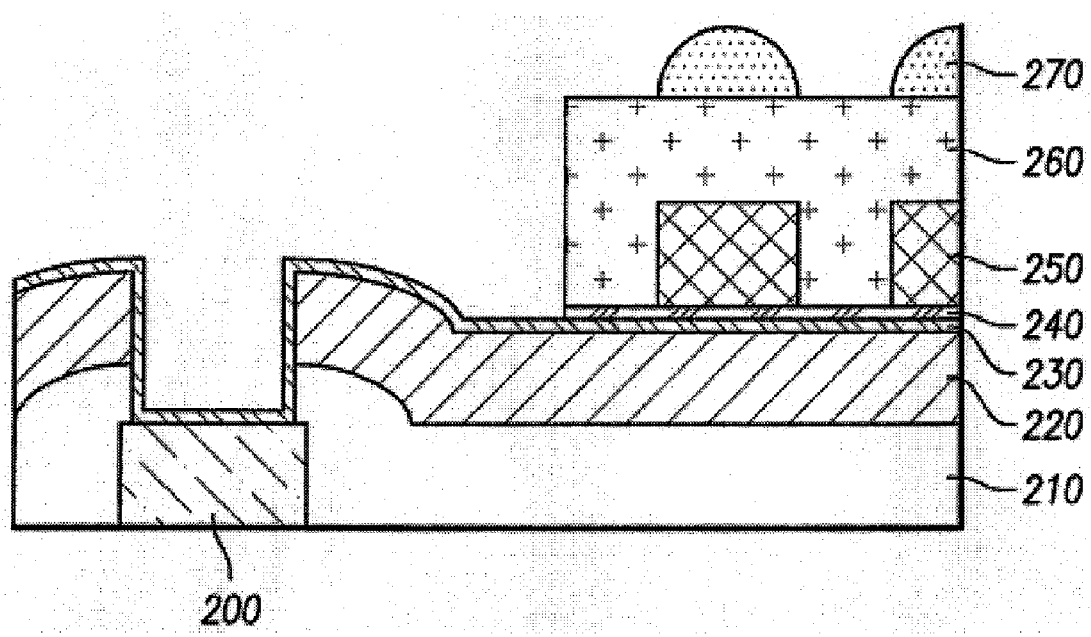

FIG. 2F is a sectional view showing a process of forming a micro-lens 270 over the planarization layer 260.

Figure 2G:
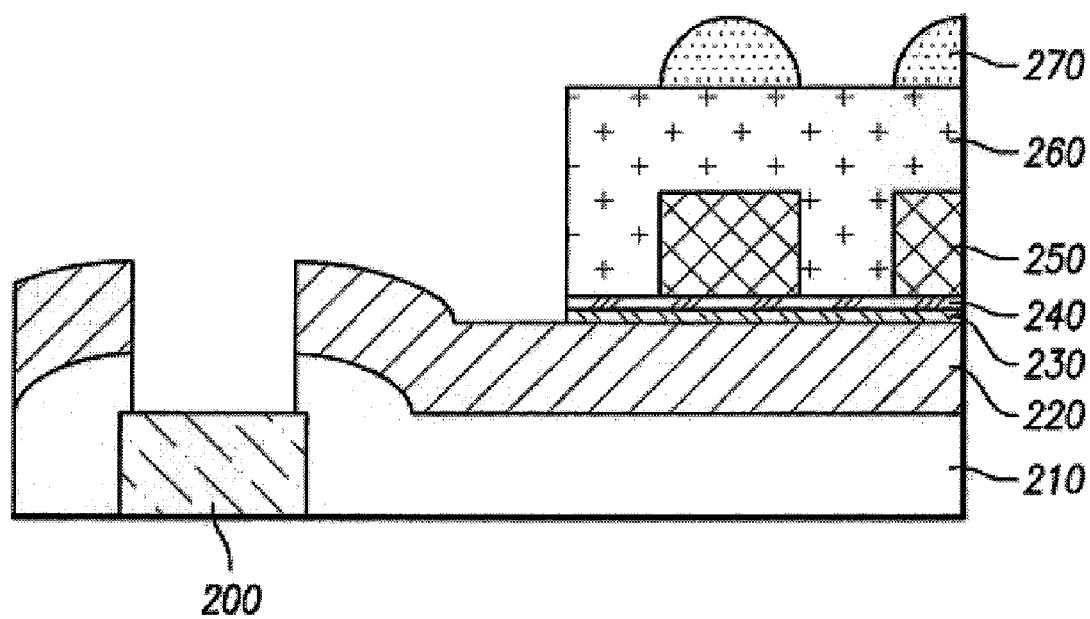

FIG. 2G is a sectional view showing a process of exposing the pad 200 by removing the PE-TEOS layer 230 through a dry etching process. Although the PE-TEOS layer 230 and the thermo setting resin layer 240 could be consecutively removed right after the micro-lens 270 is formed, the thermo setting resin layer 240 is removed after performing the planarization process, and the PE-TEOS layer 230 is removed after forming the micro-lens. If the PE-TEOS layer 230 and the thermo setting resin layer 240 are consecutively removed right after the micro-lens 270 is formed, the micro-lens is excessively shrunk, so the size of the micro-lens is reduced. The space between micro-lenses is expanded, so the sensitivity of the CMOS image sensor may be considerably reduced.

As described above, according to a method for manufacturing a CMOS image sensor suggested in the embodiments, the second pad protection layer has a sub-layer of the PE-TEOS layer and a sub-layer of the thermo setting resin layer, so that peeling of a color filter, pad corrosion, and pad contamination can be prevented.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for manufacturing a complementary metal oxide silicon (CMOS) image sensor comprising:
    depositing an oxide layer and a nitride layer after forming a pad over a substrate;
    exposing the pad by etching the oxide layer and the nitride layer;
    depositing a plasma enhanced-tetra ethyl ortho silicate (PE-TEOS) layer as a pad protection layer, and depositing a thermo-setting resin layer over the PE-TEOS layer;
    forming a color filter array;
    forming a planarization layer over the color filter array;
    removing the thermo-setting resin layer in a pad area;
    forming a micro-lens over the planarization layer; and
    exposing the pad by removing the plasma enhanced-tetra ethyl ortho silicate (PE-TEOS) layer in the pad area;
    wherein thickness of the thermo-setting resin layer is in the range of about 200 Å to about 600 Å.

2. The method as claimed in claim 1, wherein thickness of the plasma enhanced-tetra ethyl ortho silicate (PE-TEOS) layer is in the range of about 200 Å about 500 Å.

3. The method as claimed in claim 1, wherein the thermo-setting resin layer is removed through oxygen ashing.

4. The method as claimed in claim 3, wherein an oxygen ashing process is targeted to remove a thermo-setting resin layer between twice to triple the thickness of the thermo-setting resin layer actually deposited over the PE-TEOS layer.

5. The method as claimed in claim 3, wherein the plasma enhanced-tetra ethyl ortho silicate (PE-TEOS) layer is removed through dry etch.

6. The method as claimed in claim 1, wherein an initial thickness of the deposited planarization layer is about 10,000 Å.

7. The method as claimed in claim 1, wherein the thermo-setting resin layer and the color filter array both comprise photoresist.

* * * * *